(12) United States Patent
Ko (10) Patent No.: US 8,729,406 B2
(45) Date of Patent: May 20, 2014

(54) METHOD OF FABRICATING A PRINTED CIRCUIT BOARD

(75) Inventor: Young Gwan Ko, Gyunggi-do (KR)

(73) Assignee: Samsung Electro-Mechanics Co., Ltd, Suwon, Gyunggi-Do (KR)

( * ) Notice: Subject to any disclaimer, the term of this patent is extended or adjusted under 35 U.S.C. 154(b) by 604 days.

(21) Appl. No.: 12/559,449

(22) Filed: Sep. 14, 2009

(65) Prior Publication Data

US 2011/0024180 A1    Feb. 3, 2011

(30) Foreign Application Priority Data

Jul. 31, 2009    (KR) .................. 10-2009-0070637

(51) Int. Cl.
*H05K 1/11*    (2006.01)

(52) U.S. Cl.
USPC .......................................... 174/263; 174/262

(58) Field of Classification Search
USPC ......... 174/250, 263, 255, 257, 261, 262, 264;
29/830, 846, 825, 832, 840, 852, 842,
29/829, 831; 361/760, 761, 784
See application file for complete search history.

(56) References Cited

U.S. PATENT DOCUMENTS

| | | | | |
|---|---|---|---|---|
| 3,042,591 | A * | 7/1962 | Cado ............................. | 205/125 |
| 2003/0138992 | A1 * | 7/2003 | Rokugawa et al. ............ | 438/106 |
| 2007/0143992 | A1 * | 6/2007 | Kyouzuka ...................... | 29/830 |
| 2008/0157910 | A1 | 7/2008 | Park et al. | |
| 2008/0157911 | A1 | 7/2008 | Fajardo et al. | |
| 2010/0264549 | A1 | 10/2010 | Ko et al. | |

FOREIGN PATENT DOCUMENTS

| | | |
|---|---|---|
| JP | 2005-236244 A | 9/2005 |
| JP | 2005-243990 | 9/2005 |
| JP | 2005-243990 A | 9/2005 |
| JP | 2007-173775 A | 7/2007 |
| JP | 2009-021547 A | 1/2009 |
| KR | 1020060062903 | 6/2006 |
| KR | 1020090032836 | 4/2009 |

OTHER PUBLICATIONS

Office Action from counterpart Korean Patent Application No. 10-2009-0070637 Jan. 3, 2011, 3 pages.
Office Action from counterpart Japanese Patent Application No. 2009-213190, mailed Oct. 30, 2012, 6 pages, English Summary included.

* cited by examiner

*Primary Examiner* — Jeremy Norris
*Assistant Examiner* — Tremesha S Willis
(74) *Attorney, Agent, or Firm* — Blakely Sokoloff Taylor & Zafman LLP (57) ABSTRACT

Disclosed is a printed circuit board, which includes an insulating member having a circuit pattern embedded in one surface thereof, a bump pad formed in the insulating member so as to be connected to the circuit pattern and protruding from an outer surface of the insulating member, a build-up layer formed on one surface of the insulating member and including a build-up insulating layer and a circuit layer formed in the build-up insulating layer and having a via connected to the circuit pattern, and a solder resist layer formed on the build-up layer. A method of fabricating the printed circuit board is also provided. The printed circuit board is fabricated using a build-up process and the outermost circuit layer thereof is formed to have an embedded structure using an imprinting process, thus minimizing the separation of the circuit layer and reducing the lead time and the fabrication cost.

7 Claims, 8 Drawing Sheets

FIG.1

Prior art

FIG.2

Prior art

FIG.3

Prior art

FIG.4

Prior art

FIG.5

Prior art

FIG.6

Prior art

FIG.7

Prior art

FIG.8

Prior art

FIG.9

Prior art

FIG.10

Prior art

METHOD OF FABRICATING A PRINTED CIRCUIT BOARD

CROSS REFERENCE TO RELATED APPLICATION

This application claims the benefit of Korean Patent Application No. 10-2009-0070637, filed Jul. 31, 2009, entitled "A printed circuit board and a fabricating method the same", which is hereby incorporated by reference in its entirety into this application.

BACKGROUND OF THE INVENTION

1. Technical Field

The present invention relates to a printed circuit board (PCB) and a method of fabricating the same.

2. Description of the Related Art

Recently, in order to cope with an increase both in signal transmission speed and density of a semiconductor chip, the demand for techniques for directly mounting a semiconductor chip on a PCB is increasing. Thus, the development of a PCB having high density and high reliability capable of coping with the increase in the density of the semiconductor chip is required.

The requirements for the PCB having high density and high reliability are closely related to the specs of the semiconductor chip, and may include for example circuit fineness, high electrical properties, high signal transmission structure, high reliability, high functionality and so on. Hence, there is a need for techniques for fabricating the PCB having a fine circuit pattern and micro via holes in accordance with such requirements.

Typically, examples of a method of forming the circuit pattern of the PCB include a subtractive process, a full additive process, and a semi-additive process. Among them, a semi-additive process enabling the fineness of the circuit pattern is currently receiving attention.

FIGS. 1 to 6 are cross-sectional views sequentially showing a process of forming the circuit pattern using a semi-additive process according to an embodiment of a conventional technique. With reference to these drawings, the method of forming the circuit pattern is described below.

Figure 1:
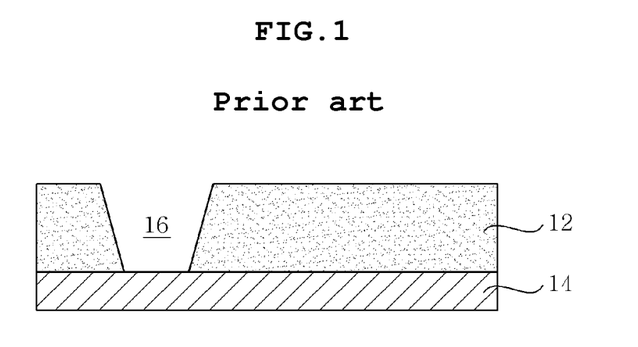
FIGS. 1 to 6 are cross-sectional views sequentially showing a process of forming a circuit pattern using a semi-additive process according to an embodiment of a conventional technique.

As shown in FIG. 1, a via hole 16 is processed in an insulating layer 12 having a metal layer 14 formed on one surface thereof.

Figure 2:
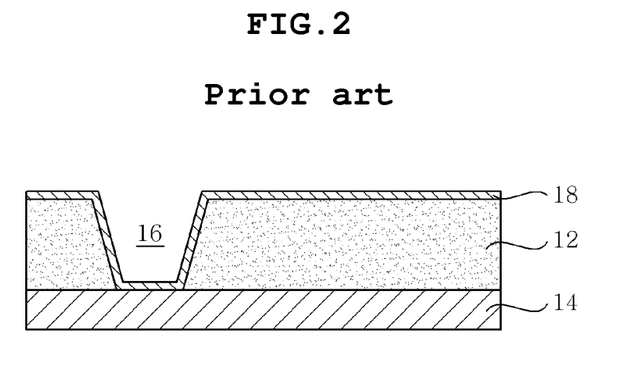

Next, as shown in FIG. 2, an electroless plating layer 18 is formed on both the insulating layer 12 and the inner wall of the via hole 16. The electroless plating process functions as a pretreatment procedure of a subsequent electroplating process, and the electroless plating layer 18 should be provided at a predetermined thickness or more (e.g. 1 μm or more) in order to form an electroplating layer 24.

Figure 3:
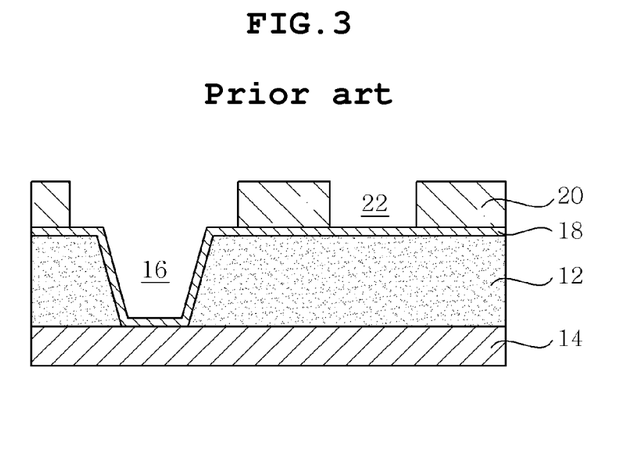

Next, as shown in FIG. 3, a dry film 20 is placed thereon, and is then patterned to have an opening 22 for exposing a circuit pattern forming region.

Figure 4:
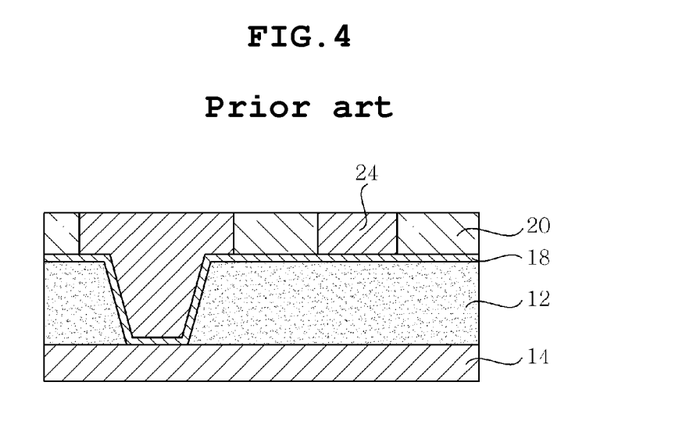

Next, as shown in FIG. 4, the electroplating layer 24 is formed in both the opening 22 and the via hole 16.

Figure 5:
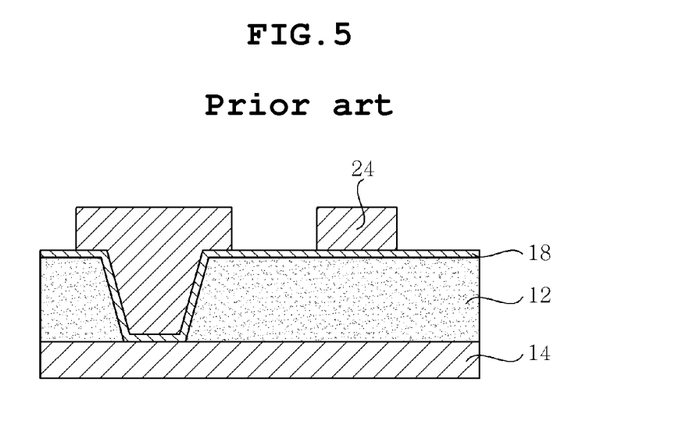

Next, as shown in FIG. 5, the dry film 20 is removed.

Figure 6:
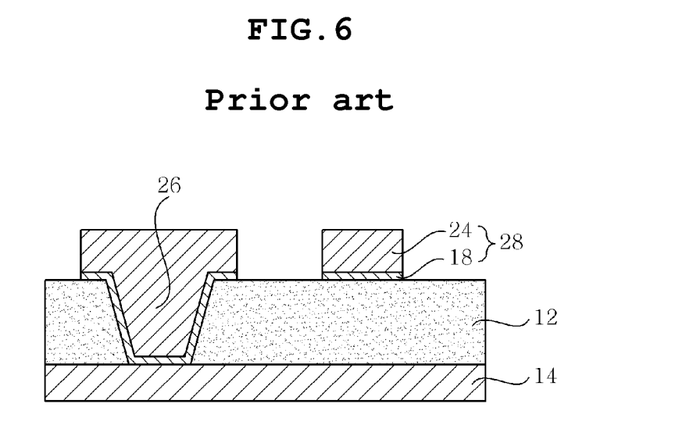

Finally, as shown in FIG. 6, a portion of the electroless plating layer 18 on which the electroplating layer 24 is not formed is removed through flash etching, quick etching or the like, thus forming the circuit pattern 28 including a via 26.

However, because the circuit pattern 28 resulting from the conventional semi-additive process is provided in the form of a positive pattern on the insulating layer 12, it may be undesirably separated from the insulating layer 12. In particular, as the circuit pattern 28 becomes finer, the contact area between the insulating layer 12 and the circuit pattern 28 is reduced, thus weakening adhesivity therebetween, so that the circuit pattern 28 is easily separated. In a multilayered PCB, the separation of the circuit pattern 28 formed on the outermost layer drastically deteriorates the reliability of the PCB.

With the recent goal of overcoming the above problem, a new process is proposed. For example, there is LPP (Laser Patterning Process) including forming a trench in an insulating layer using a laser and performing plating, polishing and etching thus forming a circuit pattern.

FIGS. 7 to 10 are cross-sectional views sequentially showing a process of forming the circuit pattern using LPP according to another embodiment of a conventional technique.

Figure 7:
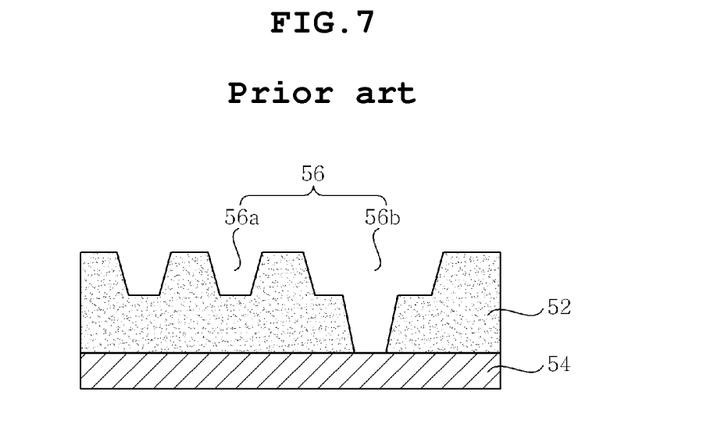
FIGS. 7 to 10 are cross-sectional views sequentially showing a process of forming a circuit pattern using LPP according to another embodiment of a conventional technique.

First, as shown in FIG. 7, a trench 56 including a circuit pattern trench 56a and a bump pad trench 56b is processed using a laser in an insulating layer 52 having a metal layer 54 formed on one surface thereof.

Figure 8:
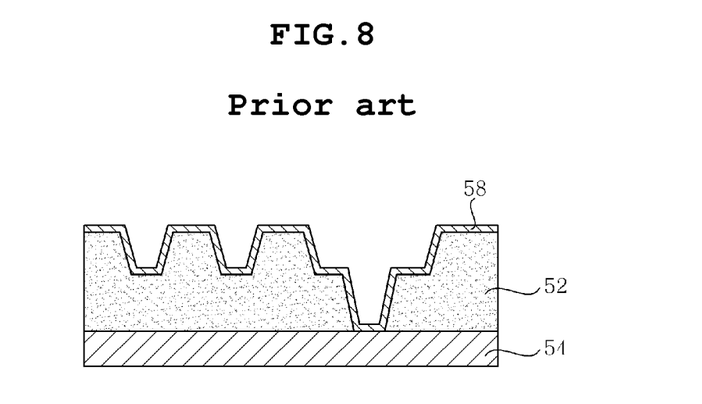

Next, as shown in FIG. 8, an electroless plating layer 58 is formed on both the insulating layer 52 and the inner wall of the trench 56.

Figure 9:
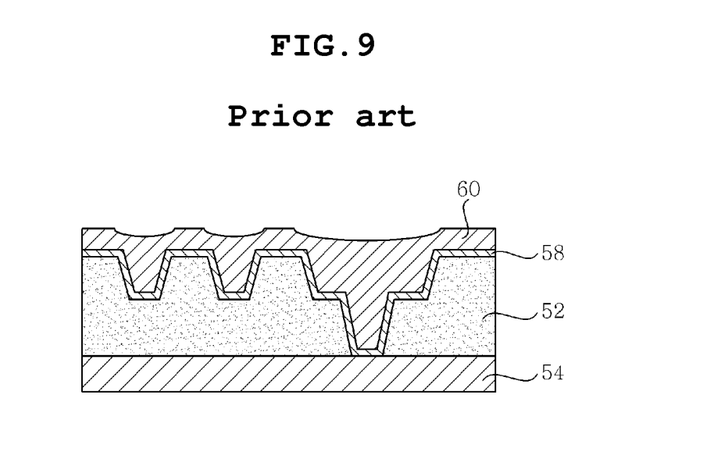

Next, as shown in FIG. 9, an electroplating layer 60 is formed on the electroless plating layer 58.

Figure 10:
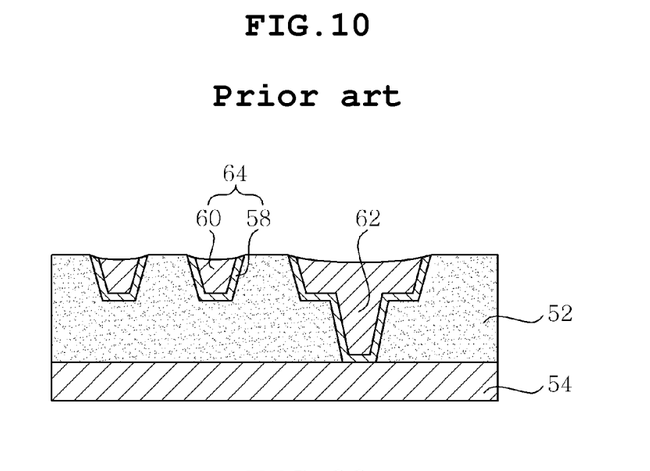

Finally, as shown in FIG. 10, portions of the electroless plating layer 58 and the electroplating layer 60, which are protruding from the upper surface of the insulating layer, are removed through etching or grinding, thus forming an embedded circuit pattern 64 having a via 62.

In the case where the PCB is fabricated using LPP, the circuit pattern 64 is embedded and thus the separation thereof may be advantageously prevented. However, in order to reduce plating deviation occurring between the region having the trench 56 and the region having no trench, an additional polishing process should be performed, and also, trench processing and polishing should be conducted in respective layers, undesirably prolonging the lead time. Furthermore, because equipment used in the formation of the trench is expensive, the fabrication cost is undesirably increased. Therefore, it is difficult to fabricate the multilayered PCB using only LPP.

SUMMARY OF THE INVENTION

Accordingly, the present invention has been made keeping in mind the problems encountered in the related art and the present invention intends to provide a PCB and a method of fabricating the same, in which the PCB is fabricated using a build-up process and the outermost circuit layer thereof is formed to have an embedded structure using a simple imprinting process, thus minimizing the separation of the circuit layer and reducing the lead time and the fabrication cost.

Also the present invention intends to provide a PCB which has bump pads having a uniform diameter and height with fine pitches, and a method of fabricating the same.

An aspect of the present invention provides a PCB including an insulating member having a circuit pattern embedded in one surface thereof, a bump pad formed in the insulating member so as to be connected to the circuit pattern and protruding from an outer surface of the insulating member, a build-up layer formed on one surface of the insulating member and including a build-up insulating layer and a circuit layer formed in the build-up insulating layer and having a via connected to the circuit pattern, and a solder resist layer formed on the build-up layer.

In this aspect, a pattern trench may be formed in a portion of the insulating member in a thickness direction, and thus the circuit pattern may be formed in the pattern trench.

In this aspect, the bump pad may be formed such that a lower portion thereof is embedded in the insulating member and an upper portion thereof protrudes from the insulating member.

In this aspect, the bump pad may be formed of a plating layer.

In this aspect, a surface treatment layer may be formed on a surface of the bump pad protruding from the outer surface of the insulating member.

In this aspect, an opening for exposing a pad of the circuit layer may be formed in the solder resist layer.

Another aspect of the present invention provides a method of fabricating the PCB, including (A) sequentially forming a release layer and an insulating member on a carrier, and then processing a pattern trench in the insulating layer and a bump pad trench passing through the insulating member and the release layer using an imprinting process, (B) performing plating in the pattern trench and the bump pad trench, thus forming a circuit pattern and a bump pad, (C) forming a build-up insulating layer on the insulating member, and then forming a circuit layer having a via for interlayer connection, and (D) forming a solder resist layer on the build-up insulating layer, and then removing the carrier and the release layer.

In this aspect, in (A), the pattern trench may be formed in a portion of the insulating member in a thickness direction.

In this aspect, in (A), the release layer and the insulating member may be formed on either or both surfaces of the carrier.

In this aspect, the release layer may be formed of a resin material.

In this aspect, (B) may include (B1) forming an electroless plating layer on both a surface of the insulating member and inner walls of the pattern trench and the bump pad trench, (B2) forming an electroplating layer in the pattern trench and the bump pad trench, and (B3) removing portions of the electroless plating layer and the electroplating layer, which are formed on the insulating member.

In this aspect, (D) may include (D1) forming the solder resist layer on the build-up insulating layer, (D2) processing in the solder resist layer an opening for exposing a pad of the circuit layer, (D3) removing the carrier, (D4) forming a surface treatment layer on an exposed surface of the bump pad, and (D5) removing the release layer.

BRIEF DESCRIPTION OF THE DRAWINGS

The features and advantages of the present invention will be more clearly understood from the following detailed description taken in conjunction with the accompanying drawings, in which.

DESCRIPTION OF SPECIFIC EMBODIMENTS

Hereinafter, a detailed description will be given of embodiments of the present invention with reference to the accompanying drawings. Throughout the drawings, the same reference numerals refer to the same or similar elements, and redundant descriptions are omitted. In the description, in the case where known techniques pertaining to the present invention are regarded as unnecessary because they make the characteristics of the invention unclear and also for the sake of description, the detailed descriptions thereof may be omitted.

Furthermore, the terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept implied by the term to best describe the method he or she knows for carrying out the invention.

PCB

Figure 11:
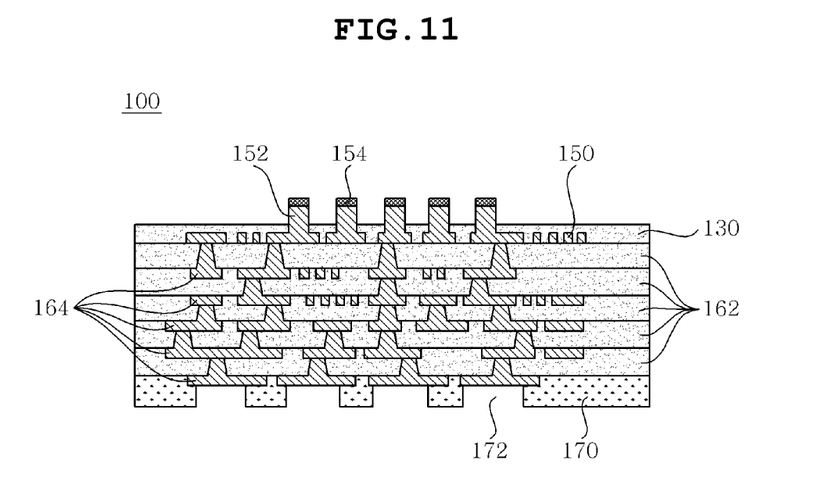
FIG. 11 is a cross-sectional view showing a PCB according to an embodiment of the present invention.

FIG. 11 is a cross-sectional view showing a PCB according to an embodiment of the present invention. With reference to this drawing, the PCB 100 according to the present embodiment is described below.

As shown in FIG. 11, the PCB 100 according to the present embodiment includes an insulating member 130 having a circuit pattern 150 embedded in one surface thereof, bump pads 152 formed to protrude from the outer surface of the insulating member 130 while being formed in the insulating member 130 so as to be connected to the circuit pattern 150, a build-up layer 160, and a solder resist layer 170.

The circuit pattern 150 is embedded in one surface of the insulating member 130, and specifically, is embedded to be flush with one surface of the insulating member 130. As such, the circuit pattern 150 is formed by performing a plating process in a pattern trench 122 formed only in a portion of one surface of the insulating member 130 in a thickness direction.

The bump pads 152 are formed to protrude from the outer surface of the insulating member 130 while being formed in the insulating member 130 so as to be connected to the circuit pattern 150. The bump pads 152 are formed such that lower portions thereof are embedded in the insulating member 130 and upper portions thereof protrude from the insulating member 130. Namely, the bump pads 152 have a post structure having the same height. The bump pads 152 are formed of a plating layer. Also provided on a surface of the bump pads 152 protruding from the outer surface of the insulating member 130 is a surface treatment layer 154 for preventing oxidation/corrosion thereof and enhancing adhesivity to external connection terminals.

The build-up layer 160 is configured such that the build-up insulating layer 162 is formed on one surface of the insulating member 130 in which the circuit pattern 150 is embedded, and the circuit layer 164 having vias for interlayer connection is formed in the build-up insulating layer 162. The circuit layer 164 is formed to protrude from the surface of the build-up layer 160.

The solder resist layer 170 functions to protect the circuit layer 164 formed in the outermost build-up insulating layer 162 from the outside, and is disposed on the build-up insulating layer 162. As such, formed in the solder resist layer 170 are openings 172 for exposing pads of the outermost circuit layer 164.

Fabrication of PCB

FIGS. 12 to 18 are cross-sectional views sequentially showing a process of fabricating the PCB of FIG. 11. Below, the method of fabricating the PCB according to the present embodiment is specified with reference to the above drawings.

Figure 12:
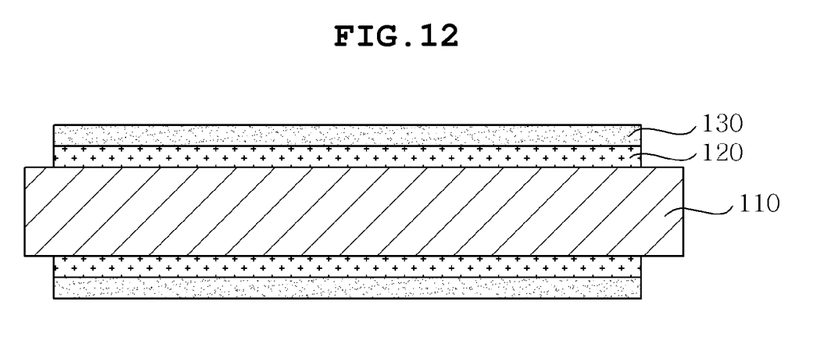
FIGS. 12 to 18 are cross-sectional views sequentially showing a process of fabricating the PCB of FIG. 11.

As shown in FIG. 12, a release layer 120 and an insulating member 130 are sequentially formed on a carrier 110 responsible for a supporting function to prevent the warping of the PCB during the fabrication procedures.

The release layer 120 is formed of a resin material facilitating the separation of the insulating member 130 formed thereon and enabling trench processing using an imprinting process.

In the present embodiment, the release layer 120 and the insulating member 130 are formed to predetermined thicknesses taking into consideration the height that the bump pads 152 have been designed to have.

The release layer 120 and the insulating member 130 may be formed on either or both surfaces of the carrier 110. Below, the formation of the insulating member 130 on both surfaces of the carrier 110 is illustrative, and additional procedures are performed.

Figure 13:
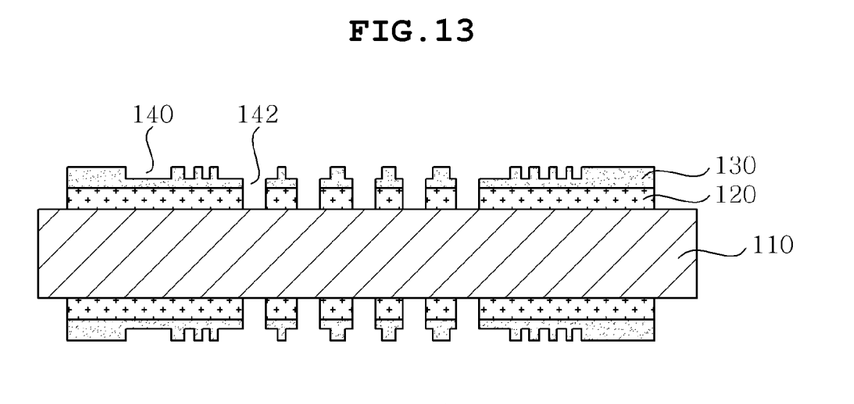

Next, as shown in FIG. 13, a pattern trench 140 is processed in the insulating member 130, and bump pad trenches 142 are formed to pass through the insulating member 130 and the release layer 120.

The pattern trench 140 is formed by removing a portion of the insulating member 130 in a thickness direction in consideration of the size and thickness of the circuit pattern 150 to be formed, and the bump pad trenches 142 are formed to pass through the insulating member 130 and the release layer 120.

As such, the pattern trench 140 and the bump pad trenches 142 are formed using an imprinting process in order to reduce the process time and the process cost, and specifically, may be formed by imprinting the insulating member 130 or the insulating member 130 and the release layer 120 with an imprint mold having a shape complementary to the shape of the trench.

Figure 14:
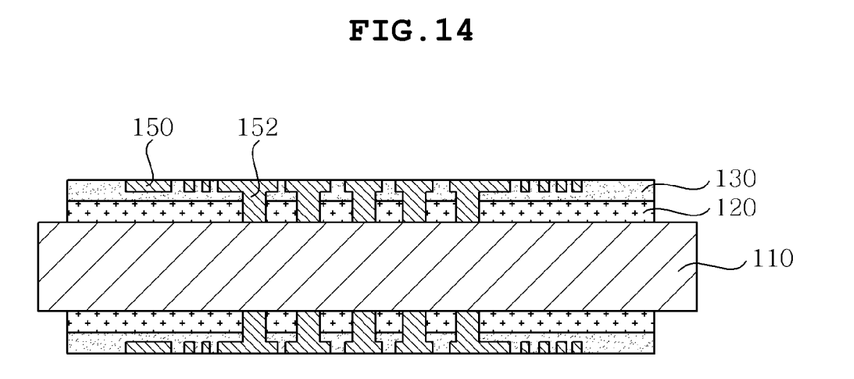

Next, as shown in FIG. 14, a plating process is performed in the pattern trench 140 and the bump pad trenches 142 thus forming the circuit pattern 150 and the bump pads 152. The circuit pattern 150 and the bump pads 152 may be obtained by forming an electroless plating layer on both the surface of the insulating member 130 and the inner walls of the pattern trench and the bump pad trenches 142 and then forming an electroplating layer on the portion of the electroless plating layer formed in the pattern trench 140 and the bump pad trenches 142. In the course of forming the plating layer in the pattern trench 140 and the bump pad trenches 142, portions of the electroless plating layer and the electroplating layer, which are formed on the insulating member 130, may be removed through mechanical and/or chemical polishing so that the circuit pattern 150 is flush with one surface of the insulating member 130 (an embedded structure).

Figure 15:
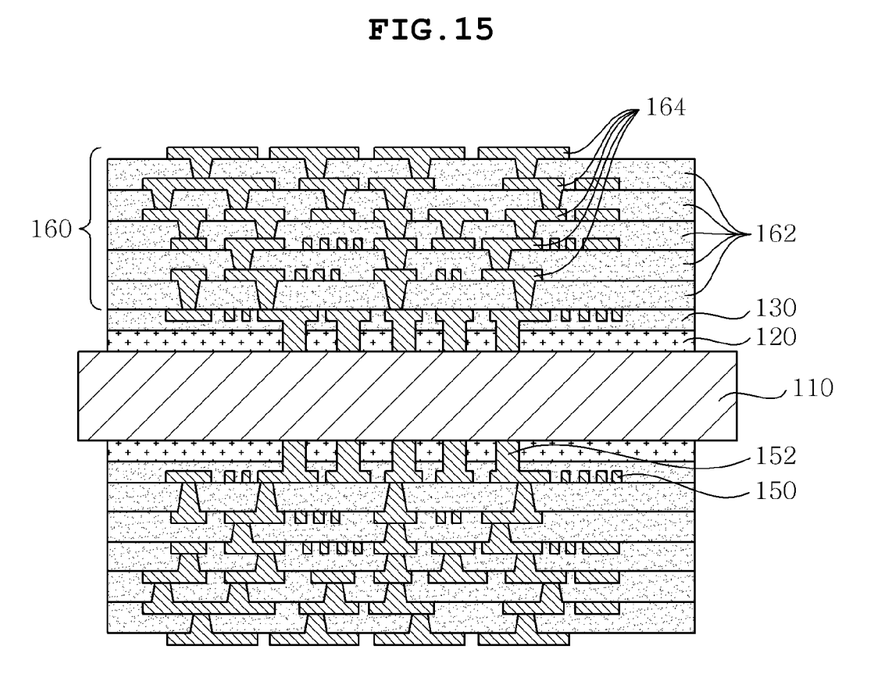

Next, as shown in FIG. 15, the build-up insulating layer 162 is formed on the insulating member 130 having the circuit pattern 150, and the circuit layer 164 having vias for interlayer connection is formed. Namely, the build-up layer 160 is formed through a build-up process. As such, the circuit layer 164 is formed by processing the via holes in the build-up insulating layer 162, forming the plating layer on both the build-up insulating layer 162 and the inner walls of the via holes and then patterning the plating layer. The circuit layer 164 formed in the build-up insulating layer 162 directly on the insulating member 130 is connected to the circuit pattern 150 through the vias.

Figure 16:
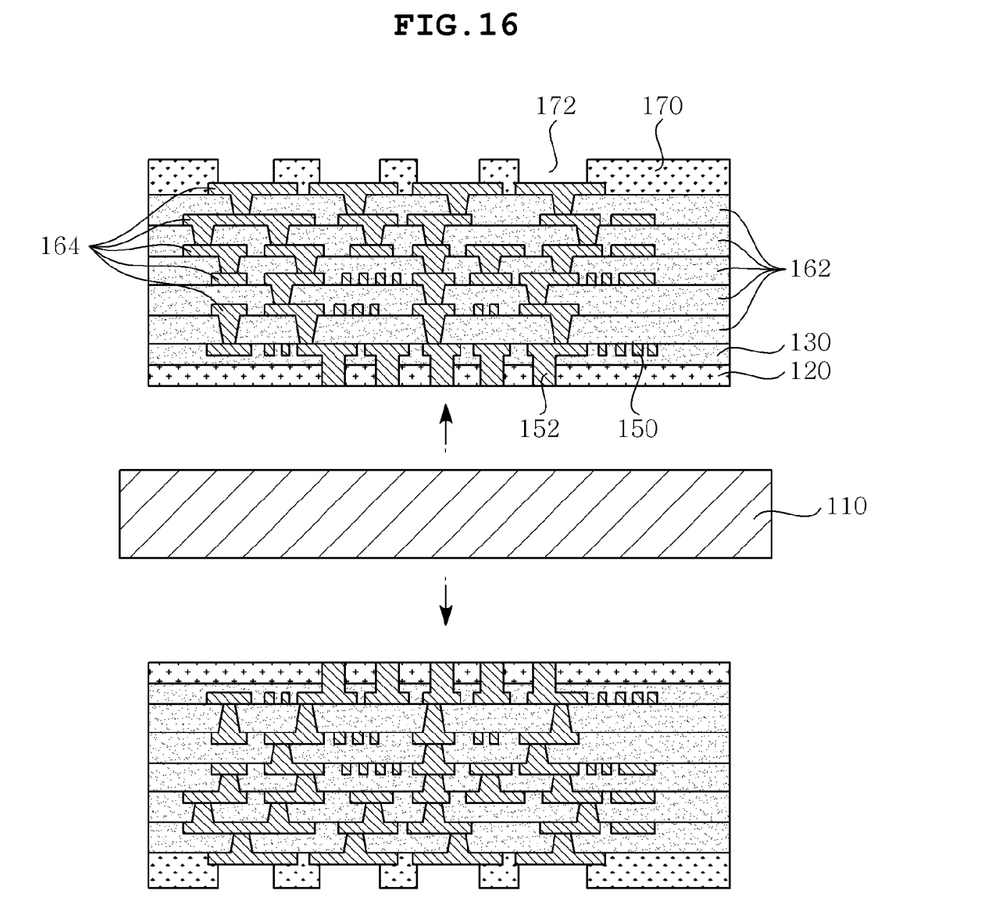

Next, as shown in FIG. 16, the solder resist layer 170 is formed on the build-up insulating layer 162, and the openings 172 which expose the pads of the outermost circuit layer 164 of the build-up insulating layer 162 are processed, after which the carrier 110 is removed. The solder resist layer 170 is formed on the outermost build-up insulating layer 162 in order to protect the outermost circuit layer 164 of the build-up insulating layer 162. The pads function as a connection terminal to the outside and are exposed by the openings 172 formed in the solder resist layer 170 using for example laser direct ablation (LDA).

Figure 17:
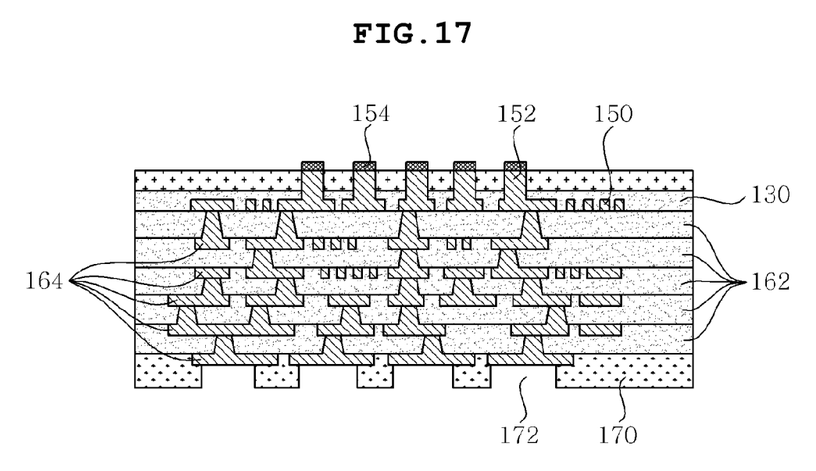

Next, as shown in FIG. 17, the surface treatment layer 154 is formed on the exposed surface of the bump pads 152. The surface treatment layer 154 functions to prevent the corrosion and oxidation of the exposed bump pads 152 and to enhance adhesivity to the external connection terminals, and the formation of the surface treatment layer may be optionally performed depending on the needs. For example, the surface treatment layer 154 may be composed of a nickel (Ni) plating layer or a Ni alloy plating layer with or without having formed thereon any one selected from among a palladium (Pd) plating layer, a gold (Au) plating layer and sequentially disposed Pd plating layer and Au plating layer, and is formed thin.

Figure 18:
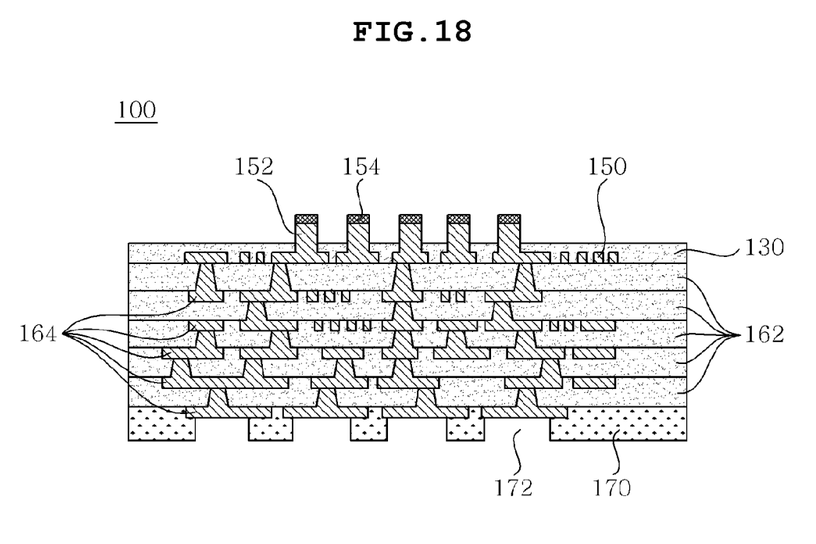

Finally, as shown in FIG. 18, the release layer 120 is removed. As such, after removal of the release layer 120, at least the portions of the bump pads 152 are formed to protrude from the outer surface of the insulating member 130.

As described hereinbefore, the present invention provides a PCB and a method of fabricating the same. According to the present invention, the PCB is fabricated using a build-up process, and the outermost circuit layer thereof is formed to have an embedded structure using an imprinting process, thus minimizing the separation of the circuit layer and reducing the lead time and the fabrication cost. Furthermore, the build-up process and the imprinting process are employed together, thus solving the interlayer mismatch problem occurring as a result of using only the imprinting process.

Also, according to the present invention, bump pads having superior electrical conductive properties are provided in the form of a post, and thus electrical connection to electronic parts mounted on the PCB becomes good. Furthermore, because the bump pads have a uniform diameter, fine pitches can be achieved.

Also, according to the present invention, the bump pads having a post shape protruding from the outer surface of the insulating member can be simply formed by processing trenches in a release layer, forming a plating layer in the trenches and then removing the release layer. As such, as the thickness of the release layer is adjusted, the bump pads can be formed at a desired height.

Although the embodiments of the present invention regarding the PCB and the method of fabricating the same have been disclosed for illustrative purposes, those skilled in the art will appreciate that a variety of different modifications, additions and substitutions are possible, without departing from the scope and spirit of the invention as disclosed in the accompanying claims. Accordingly, such modifications, additions and substitutions should also be understood to fall within the scope of the present invention.

What is claimed is:

1. A method of fabricating a printed circuit board, comprising:
   (A) sequentially forming a release layer and an insulating member on a carrier, and then processing a pattern trench in the insulating member and a bump pad trench passing through the insulating member and the release layer using an imprinting process, wherein the release layer is formed of a resin material;
   (B) performing plating in the pattern trench and the bump pad trench, thus forming a circuit pattern disposed in the insulating member and a bump pad disposed on the insulating member and the release layer;
   (C) forming a build-up insulating layer on the insulating member, and then forming a circuit layer having a via for interlayer connection; and (D) forming a solder resist layer on the build-up insulating layer, and then sequentially removing the carrier and the release layer from the insulating member so that the lower part of the bump pad is impregnated inside of the insulating member and upper part of the bump pad is protruded from the insulating member.

2. The method as set forth in claim 1, wherein, in (A), the pattern trench is formed in a portion of the insulating member in a thickness direction.

3. The method as set forth in claim 1, wherein, in (A), the release layer and the insulating member are formed on either or both surfaces of the carrier.

4. The method as set forth in claim 1, wherein (B) comprises:
(B1) forming an electroless plating layer on both a surface of the insulating member and inner walls of the pattern trench and the bump pad trench;
(B2) forming an electroplating layer in the pattern trench and the bump pad trench; and
(B3) removing portions of the electroless plating layer and the electroplating layer, which are formed on the insulating member.

5. The method as set forth in claim 1, wherein (D) comprises:
(D1) forming the solder resist layer on the build-up insulating layer;
(D2) processing in the solder resist layer an opening for exposing a pad of the circuit layer;
(D3) removing the carrier;
(D4) forming a surface treatment layer on an exposed surface of the bump pad; and
(D5) removing the release layer.

6. The method as set forth in claim 1, wherein, in (B), the pattern trench is formed in a portion of the insulating member in a thickness direction.

7. The method as set forth in claim 1, wherein, in (C), the circuit pattern is formed inside of the pattern trench and the bump pad is formed inside of the bump pad trench.

* * * * *